(12) United States Patent
Kim et al.

(10) Patent No.: US 8,934,294 B2
(45) Date of Patent: Jan. 13, 2015

(54) SEMICONDUCTOR INTEGRATED CIRCUIT DEVICE, METHOD OF MANUFACTURING THE SAME, AND METHOD OF DRIVING THE SAME

(71) Applicant: SK Hynix Inc., Gyeonggi-do (KR)

(72) Inventors: Myoung Sub Kim, Gyeonggi-do (KR); Soo Gil Kim, Gyeonggi-do (KR); Nam Kyun Park, Gyeonggi-do (KR); Sung Cheoul Kim, Gyeonggi-do (KR); Gap Sok Do, Gyeonggi-do (KR); Joon Seop Sim, Gyeonggi-do (KR); Hyun Jeong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/183,161

(22) Filed: Feb. 18, 2014

(65) Prior Publication Data
US 2014/0162429 A1    Jun. 12, 2014

Related U.S. Application Data

(62) Division of application No. 13/244,181, filed on Sep. 23, 2011, now Pat. No. 8,693,241.

(30) Foreign Application Priority Data

Jul. 13, 2011    (KR) ........................ 10-2011-0069624

(51) Int. Cl.
*G11C 11/00*    (2006.01)
*H01L 45/00*    (2006.01)
(Continued)

(52) U.S. Cl.
CPC ........ *H01L 45/1675* (2013.01); *G11C 13/0004* (2013.01); *H01L 27/2409* (2013.01); *H01L 27/249* (2013.01); *H01L 45/06* (2013.01); *H01L 45/1226* (2013.01); *H01L 45/1246* (2013.01); *H01L 45/126* (2013.01); *H01L 45/144* (2013.01);
(Continued)

(58) Field of Classification Search
CPC ........... G11C 13/0003; G11C 13/0007; G11C 13/0009; G11C 13/0064; G11C 13/0002
USPC .................. 365/163, 148, 158, 171, 173, 174
See application file for complete search history.

(56) References Cited

U.S. PATENT DOCUMENTS

2003/0002338 A1    1/2003    Xu et al.
(Continued)

OTHER PUBLICATIONS

Office Action issued by the USPTO for a divisional U.S. Appl. No. 14/183,193 of the parent U.S. Appl. No. 13/244,181 on May 15, 2014.

*Primary Examiner* — Han Yang
(74) *Attorney, Agent, or Firm* — IP & T Group LLP

(57) ABSTRACT

A semiconductor integrated circuit device, a method of manufacturing the same, and a method of driving the same are provided. The device includes a semiconductor substrate, an upper electrode extending from a surface of the semiconductor substrate; a plurality of switching structures extending from both sidewalls of the upper electrode in a direction parallel to the surface of the semiconductor substrate, and a phase-change material layer disposed between the plurality of switching structures and the upper electrode.

16 Claims, 21 Drawing Sheets

(51) Int. Cl.
 *G11C 13/00* (2006.01)
 *H01L 27/24* (2006.01)
(52) U.S. Cl.
 CPC ...... *G11C 2013/008* (2013.01); *G11C 2213/71* (2013.01)
 USPC ........... 365/163; 365/148; 365/158; 365/171; 365/173; 365/174

(56) References Cited

U.S. PATENT DOCUMENTS

| | | |
|---|---|---|
| 2006/0120136 A1 | 6/2006 | Dennison et al. |
| 2008/0175032 A1* | 7/2008 | Tanaka et al. .................. 365/51 |
| 2011/0069532 A1 | 3/2011 | Ichihara et al. |
| 2011/0122676 A1* | 5/2011 | Murooka et al. .............. 365/148 |

* cited by examiner

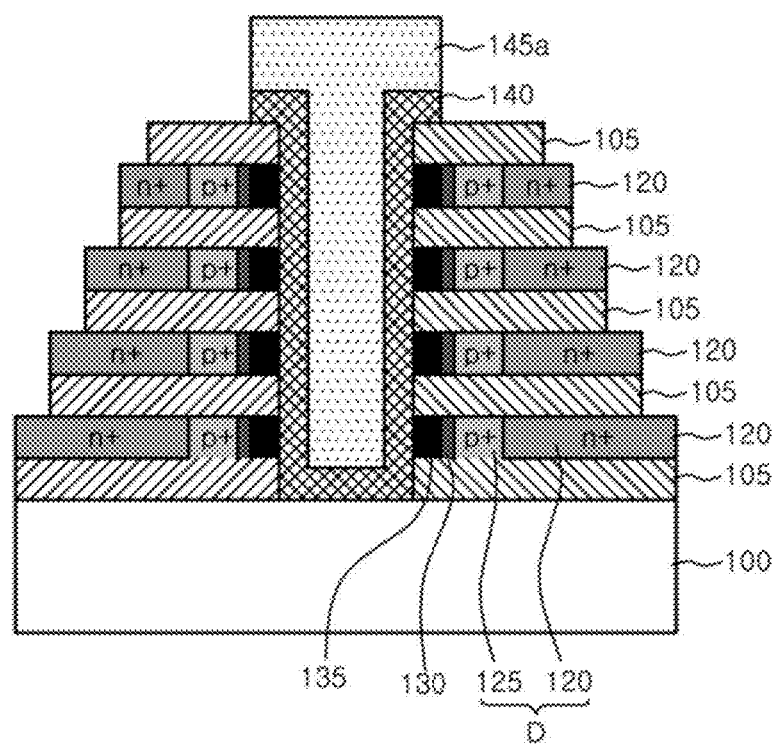

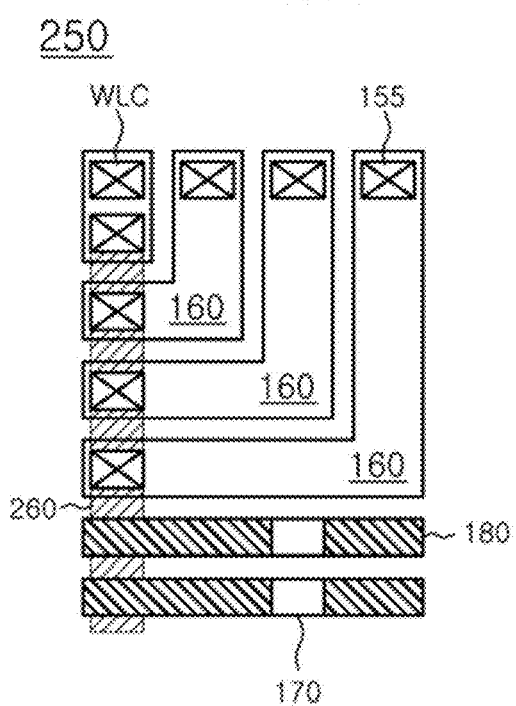

SEMICONDUCTOR INTEGRATED CIRCUIT DEVICE, METHOD OF MANUFACTURING THE SAME, AND METHOD OF DRIVING THE SAME

CROSS-REFERENCES TO RELATED APPLICATION

This application is a division of U.S. patent application Ser. No. 13/244,181 filed on Sep. 23, 2011, which claims priority under 35 U.S.C. 119(a) to Korean application number 10-2011-0069624, filed on Jul. 13, 2011 in the Korean Patent Office. The disclosure of each of the foregoing application is incorporated by reference in its entirety as if set forth in full.

BACKGROUND OF THE INVENTION

1. Technical Field

The present invention relates to a semiconductor integrated circuit device, and more particularly, to a semiconductor integrated circuit device including a phase-change memory having a stacking structure, a method of manufacturing the same, and a method of driving the same.

2. Related Art

A nonvolatile memory device, for example, a phase-change memory device, may include a phase-change material that changes resistance according to a temperature. Typically, there is a chalcogenide (GST)-based material, which is comprised of germanium (Ge), antimony (Sb) and tellurium (Te), as the phase-change material. The phase-change material changes to either an amorphous state or a crystalline state based on a temperature that defines two states "reset" (or logic "1") or "set (or logic "0").

In a dynamic random access memory (DRAM) application, a phase-change memory device may include a plurality of memory cells defined by word lines and bit lines. Each of the plurality of memory cells may include a variable resistor, including a phase-change mate and a switching device, which selectively drives the variable resistor.

In the phase-change memory device, the word line may be provided in a junction region within a semiconductor substrate, the bit line may be provided in an interconnection region, and a diode or transistor may be used as the switching device.

It is useful to improve a memory cell density in the phase-change memory device and reduce the size of a chip area. However, reducing a minimum feature size of the memory cells is limited by an exposure source.

SUMMARY

The present invention is directed to integrating more unit cells within a limited area.

According to one aspect of an exemplary embodiment, a semiconductor integrated circuit device includes a semiconductor substrate, an upper electrode extending from a surface of the semiconductor substrate with a predetermined height, a plurality of switching structures stacked and extending from both sidewalls of the upper electrode in a direction parallel to the surface of the semiconductor substrate, and a phase-change material layer disposed between the plurality of switching structures and the upper electrode.

According to another aspect of another exemplary embodiment, a semiconductor integrated circuit device includes a semiconductor substrate, an upper electrode formed on a surface of the semiconductor substrate in a pillar shape and substantially connected to a bit line, a plurality of switching structures extending from a sidewall of the upper electrode in a direction parallel to the surface of the semiconductor substrate, and a phase-change material layer disposed between the plurality of switching structures and the upper electrode and phase-changed according to an operation of the plurality of switching structures. The plurality of switching structures is alternatively stacked with an insulating layer being interposed. The plurality of switching structures is electrically connected to different word lines from each other.

According to still another aspect of another exemplary embodiment, a semiconductor integrated circuit device includes a semiconductor substrate, an upper electrode formed on the surface of the semiconductor substrate in a pillar type and substantially connected to a bit line, a plurality of switching structures extending from a sidewall of the upper electrode in a direction parallel to the surface of the semiconductor substrate, and a phase-change material layer formed along a bottom surface and a side surface of the upper electrode and be in partial contact with the plurality of switching structures to be phase-changed. The bit line is formed on a surface above the plurality of switching structures. The plurality of switching structures are alternatively stacked with an insulating layer being interposed and electrically connected to difference word lines, respectively and the bit line and the word line are substantially perpendicular to each other.

According to yet another aspect of another exemplary embodiment, a method of fabricating a semiconductor integrated circuit device is provided. The method includes forming a multi-layered insulating structure on a semiconductor substrate, forming a vertical hole in a predetermined portion of the multi-layered insulating structure, forming a plurality of horizontal holes in the multi-layered insulating structure at both sides of the vertical hole and extending in a direction parallel to the semiconductor substrate, forming switching structures in the plurality of horizontal holes, respectively, forming a phase-change material layer formed on sidewalls of the switching structures, and forming an upper electrode within the vertical hole to be in contact with the phase-change material layer.

According to yet another aspect of another exemplary embodiment, a method of driving a semiconductor integrated circuit device is provided. The method includes applying 0V to a word line connected to one of the plurality of switching structures which drives a cell to be selected and applying a programming voltage to non-selected word lines, and applying a write voltage or a read voltage to a bit line of the plurality of bit lines corresponding to the cell to be selected, and causing non-selected bit lines to be floating or grounded.

These and other features, aspects, and embodiments are described below in the section entitled "DESCRIPTION OF EXEMPLARY EMBODIMENT".

BRIEF DESCRIPTION OF THE DRAWINGS

The above and other aspects, features, and advantages of the subject matter of the present disclosure will be more clearly understood from the following detailed description taken in conjunction with the accompanying drawings, in which:

FIGS. 2A to 2I are cross-sectional views taken along a bit line extension direction of FIGS. 1A to 1F;

FIG. 4 is a plan view illustrating a peripheral circuit area according to an exemplary embodiment;

DESCRIPTION OF EXEMPLARY EMBODIMENT

Figure 1A:
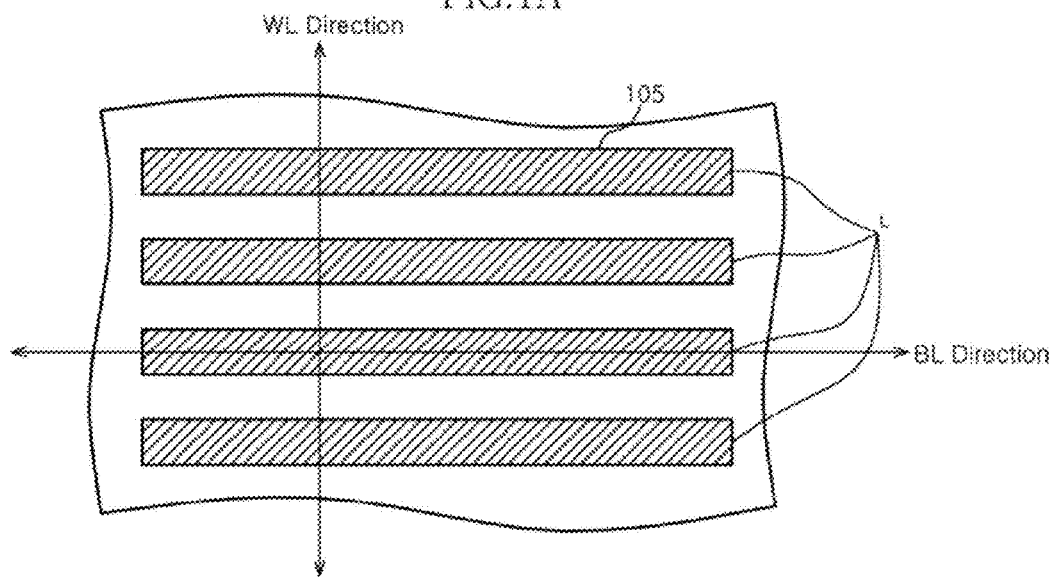
FIGS. 1A to 1F are plan views sequentially illustrating a process of manufacturing a semiconductor integrated circuit device according to an exemplary embodiment.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 2A:
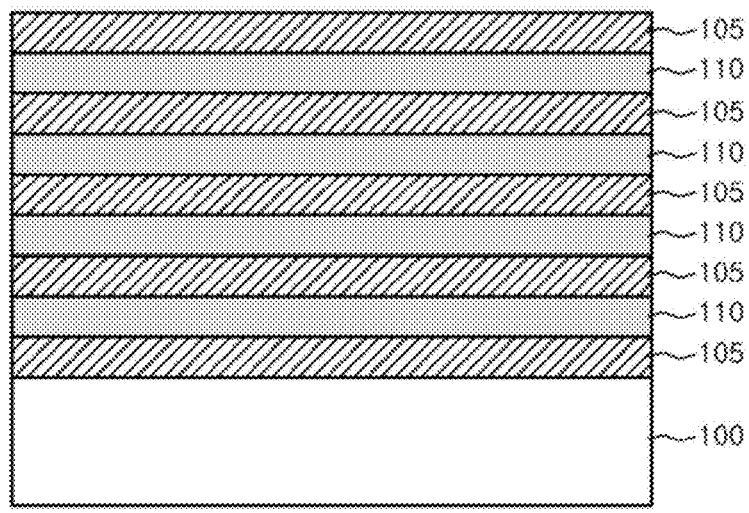
Figure 3A:
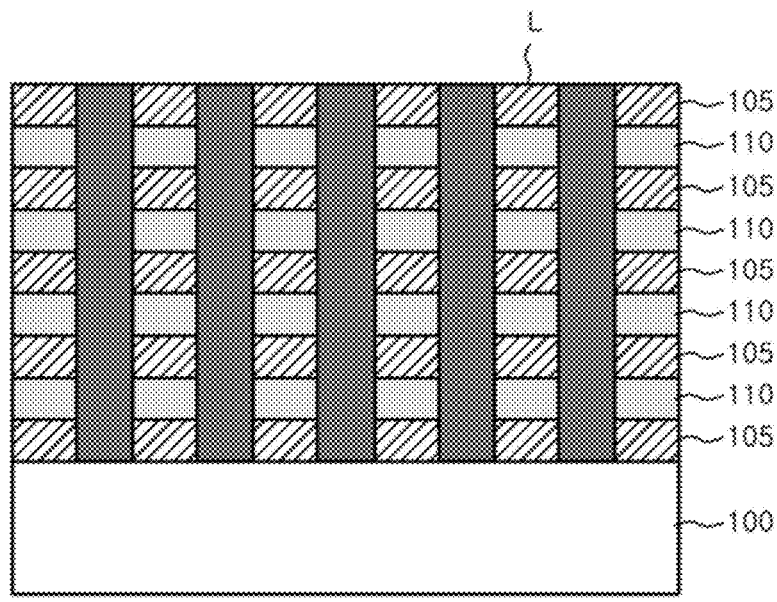
FIGS. 3A to 3I are cross-sectional views taken along a word line extension direction of FIGS. 1A to 1F.

A phase-change memory device will be described as an example of the semiconductor integrated circuit device in the exemplary embodiment, First, referring to FIGS. 1A, 2A, and 3A, a first material layer 105 and a second material layer 110 that have different etch selectivity from each other are alternatively stacked on a semiconductor substrate 100 to form a stacked insulating structure. The stacked insulating structure has the first material layer 105 formed on a surface of the semiconductor substrate 100 and in an uppermost layer. The stacked insulating structure is patterned in a rectangular prism shape extending in the bit line extension (BL) direction. This patterning forms a rectangular prism stacking structure L. The rectangular prism stacking structure L may be used as an active region of a phase-change memory device. The first material layer 105 may include an insulating layer formed of a silicon oxide layer, and the second material layer 110 may include an insulating layer formed of a silicon nitride layer.

Figure 1B:
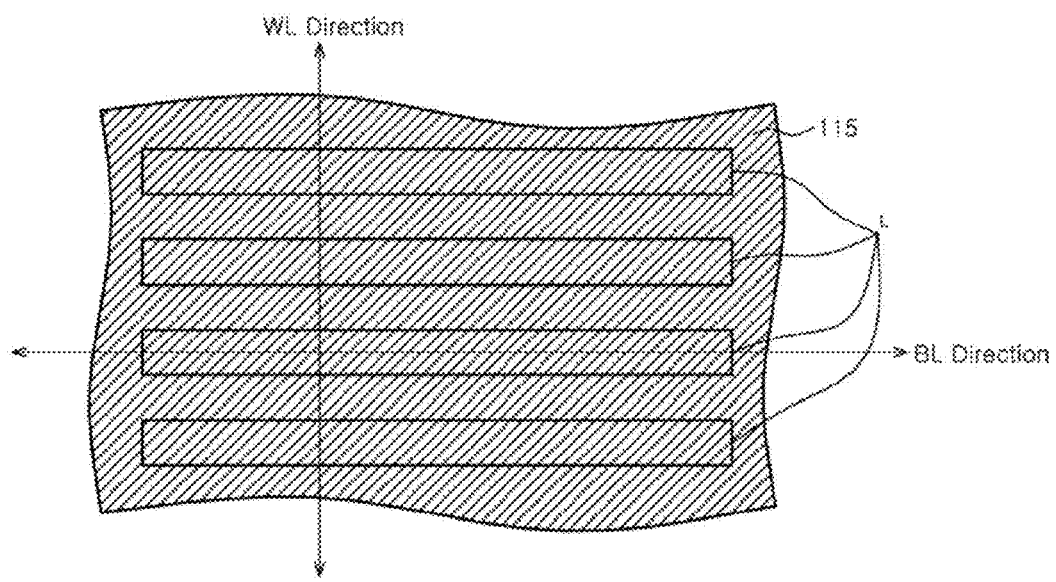
Figure 3B:
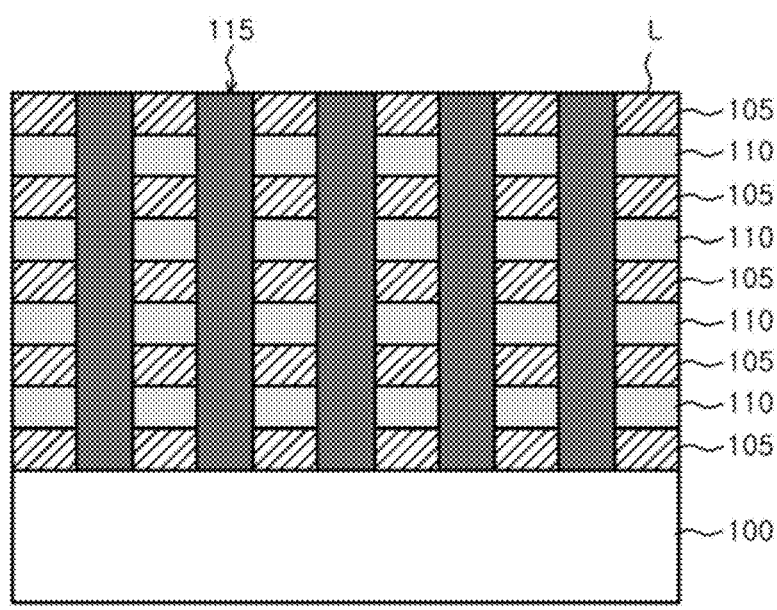

Subsequently, referring to FIGS. 1B and 3B a third material layer 115 is deposited to a designed thickness on a resultant structure including the semiconductor substrate 100 and the rectangular prism stacking structures L between the rectangular prism stacking structures L. The third material layer 115 may be formed of substantially the same silicon oxide-based insulating layer as the first material layer 105.

Figure 1C:
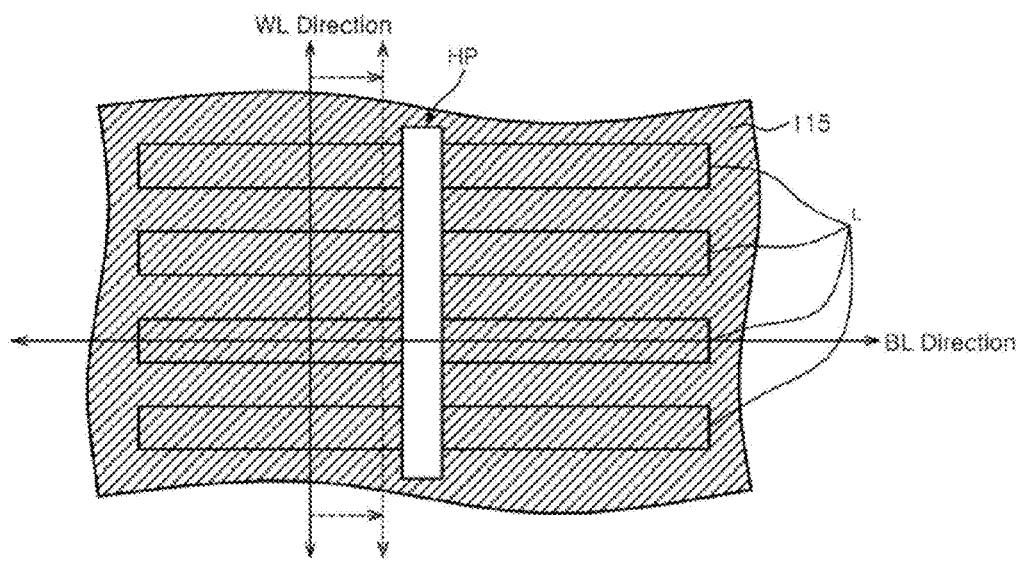
Figure 2B:
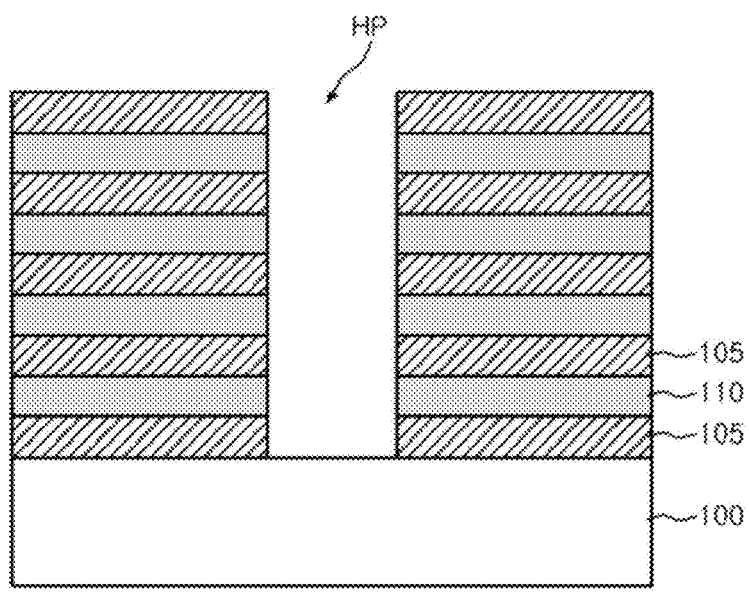
Figure 3C:
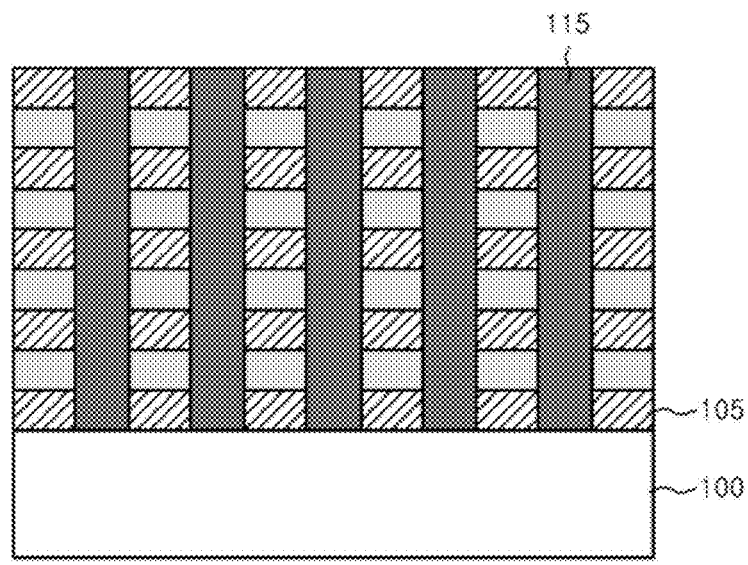

Referring to FIGS. 1C, 2B, and 3C a vertical hole HP is formed centrally in the rectangular prism stacking structures L. The vertical hole HP is formed the WL direction and has a fixed height from the surface of the substrate 100.

Figure 2C:
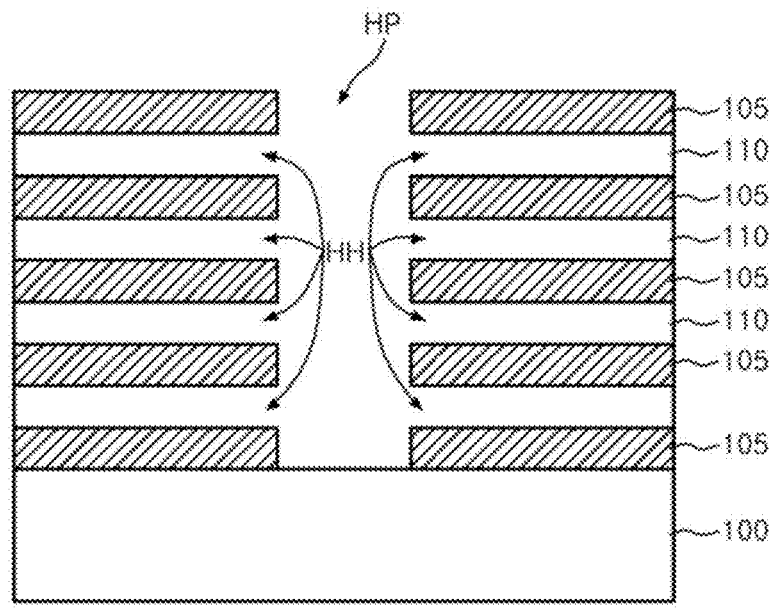
Figure 3D:
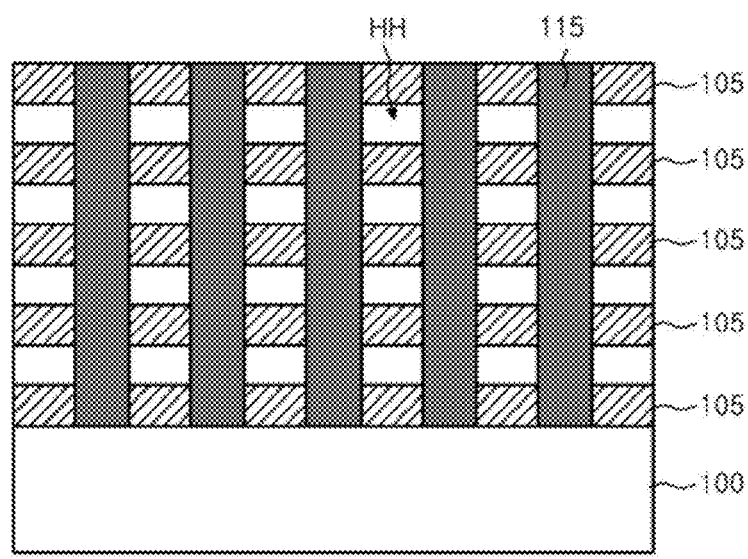

Referring to FIGS. 2C and 3D, a pull-back process is performed to remove the second material layer 110 of the rectangular prism stacking structure L, thereby forming a plurality of horizontal holes HH. The second material layer 110 is removed in the pull-back process by an etching material that enters through the vertical hole HP to form horizontal holes HH in a region where the second material layers 110 were formed. For example, when the second material layers 110 are silicon nitride layers, only the second material layers 110 may be selectively removed by dipping a resultant structure of the semiconductor substrate 100 in an etching material, for example, a phosphoric acid ($PH_3$) solution. Although the second material layers 110 are selectively removed, the first and third material layers 105 and 115 were formed in a lattice shape so that the rectangular prism stacking structure L does not collapse.

Figure 2D:
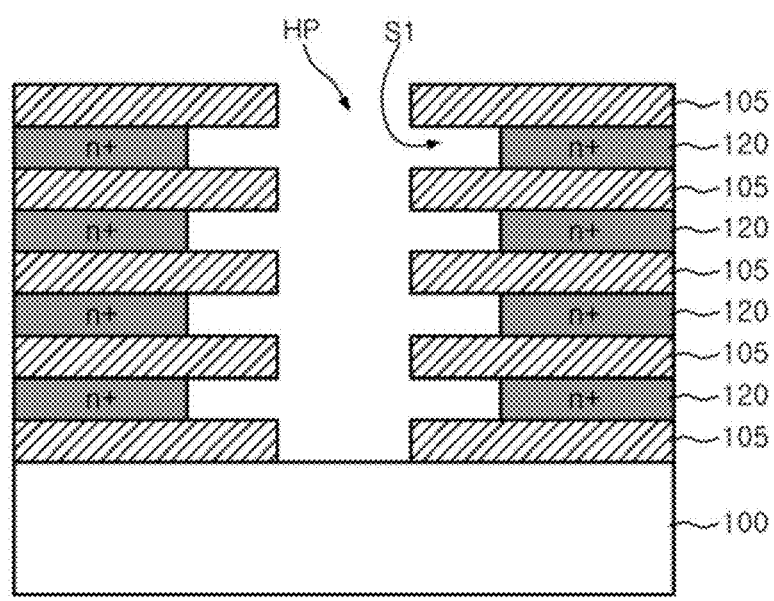
Figure 3E:
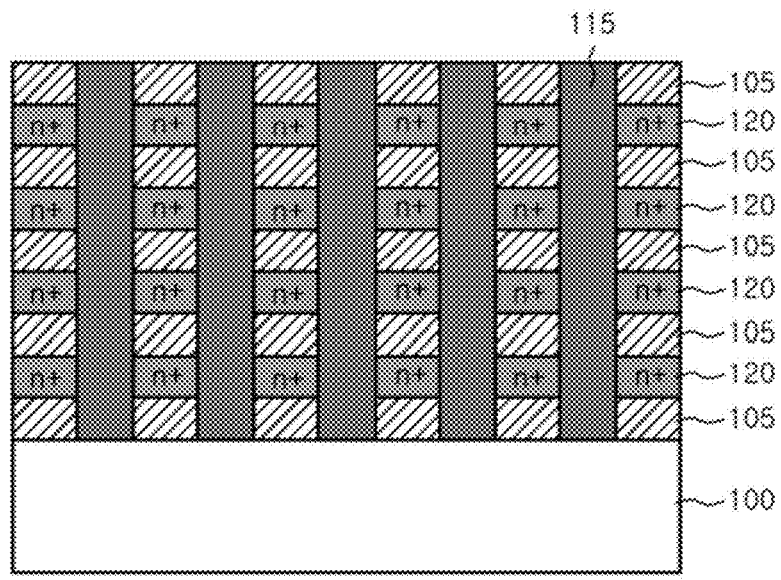

Referring to FIGS. 2D and 3E an $n^+$-polysilicon layer 120 is formed within each of the horizontal holes HH. The $n^+$-polysilicon layers 120 may first be deposited, and then a pull-back process may be performed so that the $n^+$-polysilicon layers 120 partially fill each of the horizontal holes HH. Spaces S1 are provided between the $n^+$-polysilicon layers 120 and the vertical hole HP in each horizontal hole HH.

Figure 2E:
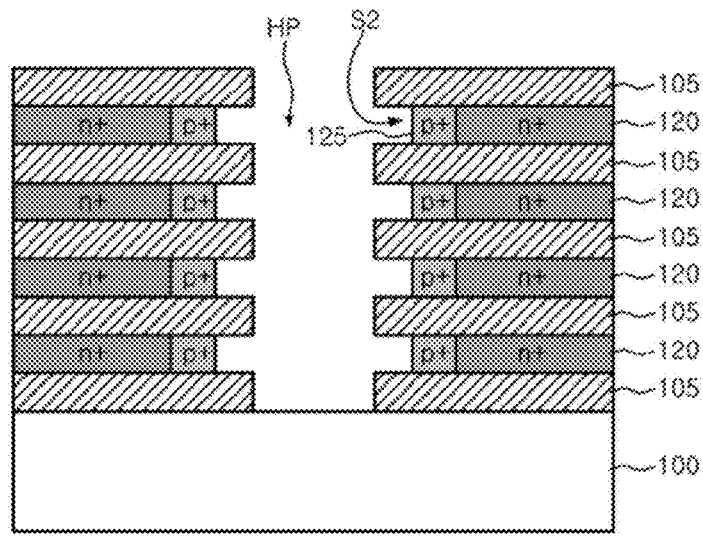
Figure 3F:
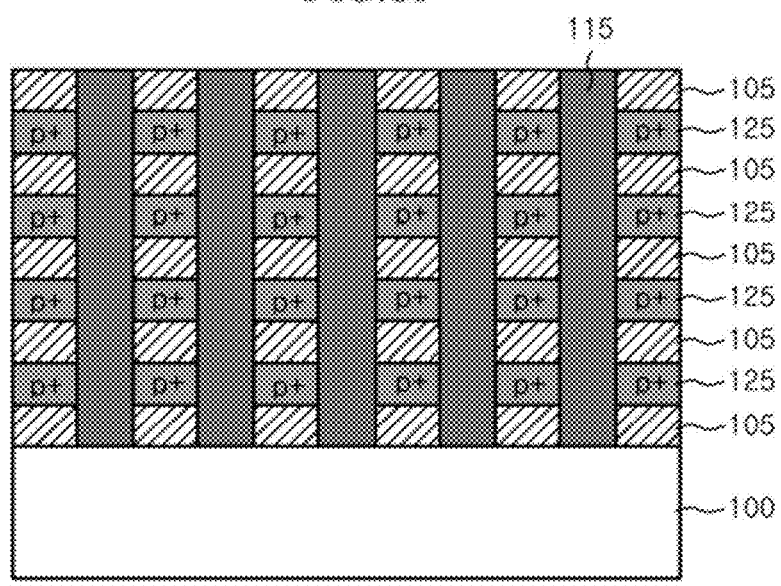

Referring to FIGS. 2E and 3F, $p^+$-polysilicon layers 125 are formed in the spaces S1 and partially fill the spaces S1. The part of the spaces S1 that is not filled by the $p^+$ polysilicon layers 125 will hereinafter be called spaces S2. The $p^+$-polysilicon layer 125 may also be formed by a deposition process and a pull-back process. FIG. 1C illustrates a dotted line extending in the WL direction. The line is shifted in the BL direction to illustrate the addition of the $p^+$ polysilicon layers 125.

Figure 2F:
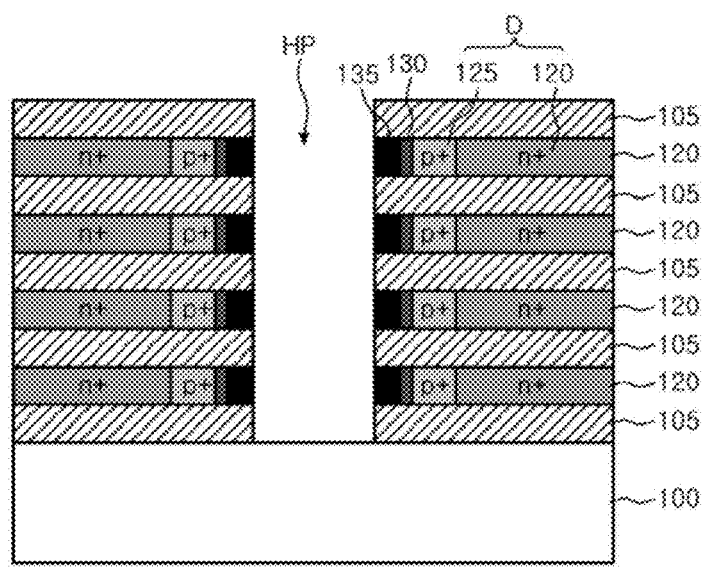

Referring to FIG. 2F ohmic contact layers 130 are formed next to the $p^+$-polysilicon layer 125 in the spaces S2. The ohmic contact layers 130 may be formed of a silicide layer. Heating electrodes 135 are formed next to the ohmic contact layer 130 to fill the spaces S2. The heating electrodes 135 may be formed of a titanium/titanium nitride (Ti/TiN) layer. However, exemplary embodiments of the present invention are not limited to a Ti/TiN layer, and the heating electrodes 135 may be formed of various materials. The heating electrodes 135 may completely fill the space S2. Through the above described process, a switching structure is formed including the $n^+$ polysilicon layers 120, the $p^+$ polysilicon layers 125, the ohmic contact layers 130, and the heating electrodes 135. The switching structure includes a diode formed of the $n^+$polysilicon layers 120, the $p^+$ polysilicon layers 125.

Figure 1D:
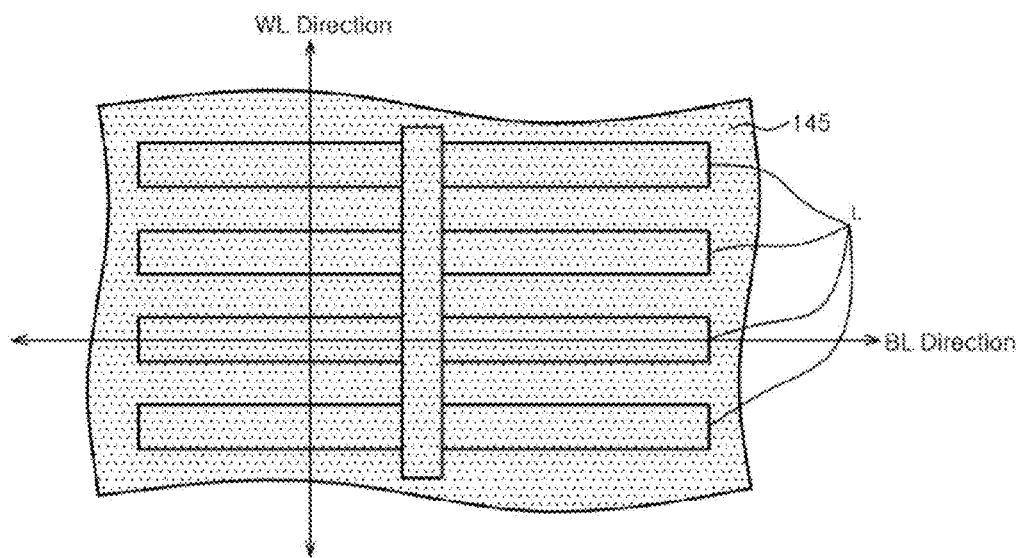
Figure 2G:
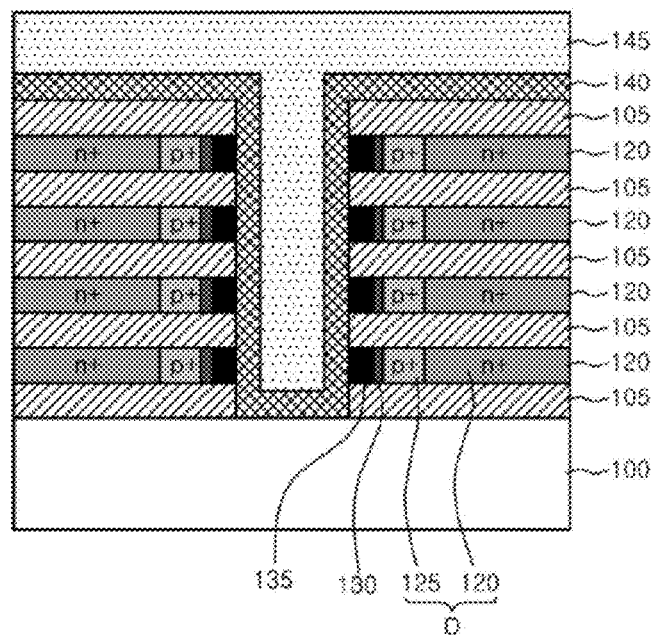
Figure 3G:
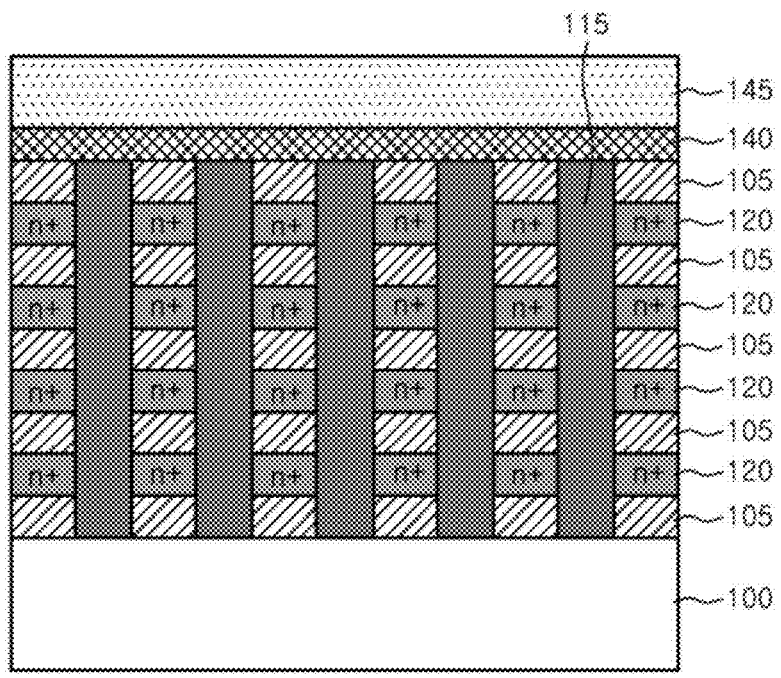

Referring to FIGS. 1D, 2G, and 3G, a phase-change material layer 140 and an upper electrode layer 145 are sequentially formed on a resultant surface including the semiconductor substrate 100 and the switching structure. The phase-change material layer 140 may be formed of a chalcogenide (GST) layer, but exemplary embodiments of the present invention are not limited to a chalcogenide (GST) layer. Although not shown, a resistive memory layer, other than the phase-change material layer 140, may be formed so that the semiconductor integrated circuit device may be driven as a resistive memory device. The phase-change material layer 140 is formed above the uppermost first material layers 105 of the switching structure and along the sidewall of the vertical hole HP so that the phase-change material layer 140 is in contact with the respective heating electrodes 135. The upper electrode 145 may fill the vertical hole and cover the switching structure.

Figure 1E:
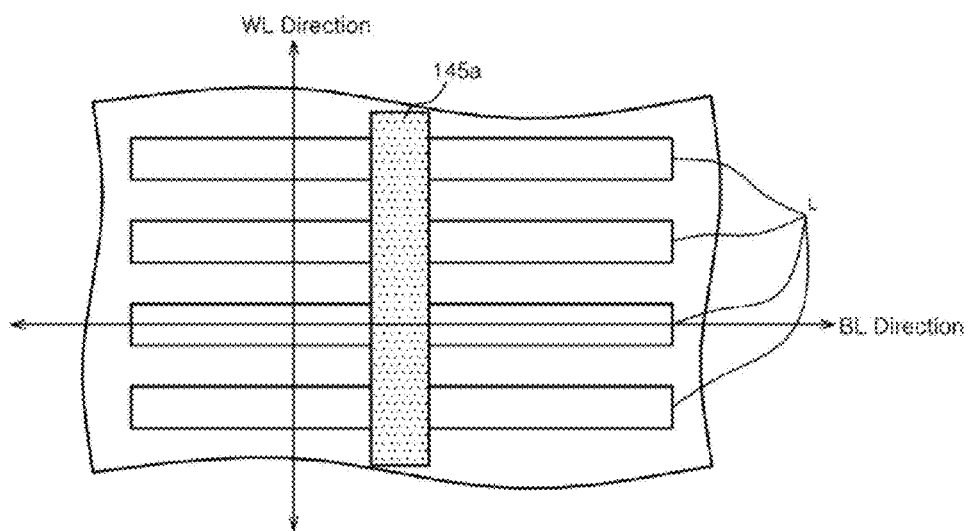
Figure 2H:
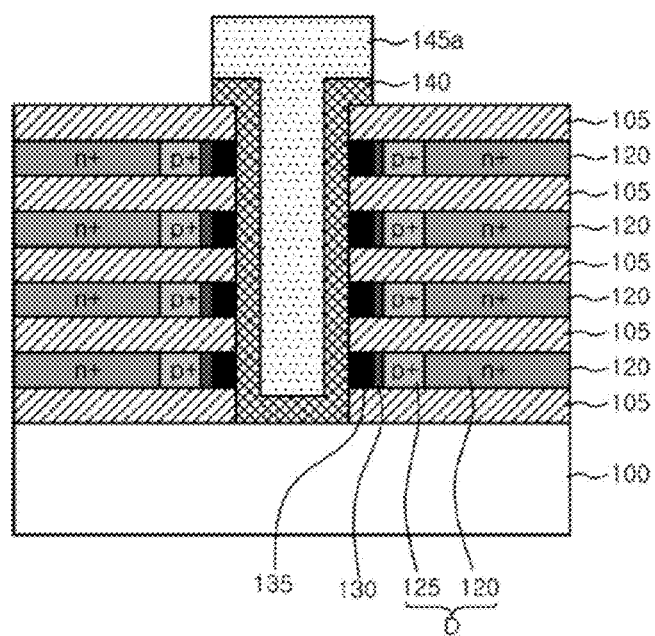
Figure 3H:
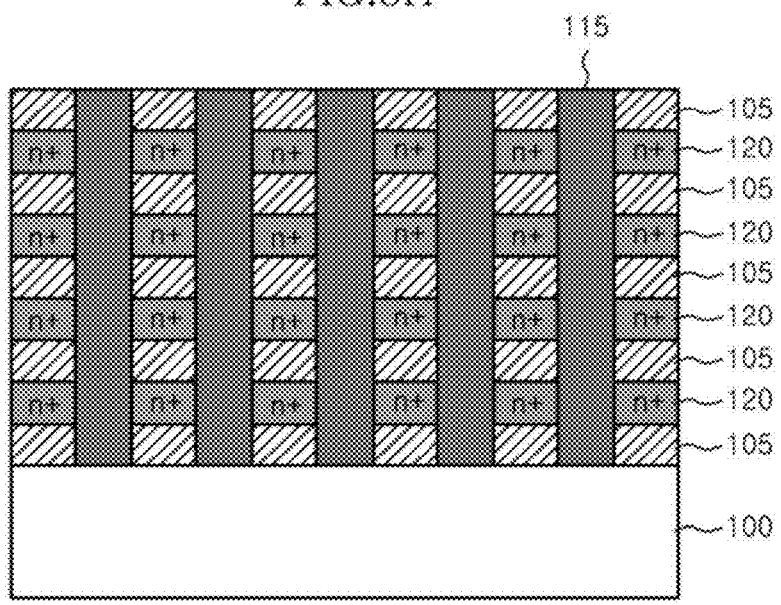

Referring to FIGS. 1E, 2H, and 3H, the upper electrode layer 145 and the phase-change material layer 140 are patterned so that the upper electrode layer 145 and the phase-change material layer 140 remain in and around the vertical hole HP. The etching process forms a phase change structure that may be, for example, a resistive memory unit including an upper electrode 145a and the phase-change material layer 140. As shown in FIG. 2H, switching structures are formed on both sides of the resistive memory unit. Referring to FIG. 2I, the n⁺-polysilicon layers 120 and the first material layers 105 are pyramid-processed so that both sides of the stacking structure are exposed in a cascaded shape. The pyramid-processing is completed by iteratively performing a photoresist slimming process and a reactive ion etching process.

Figure 1F:
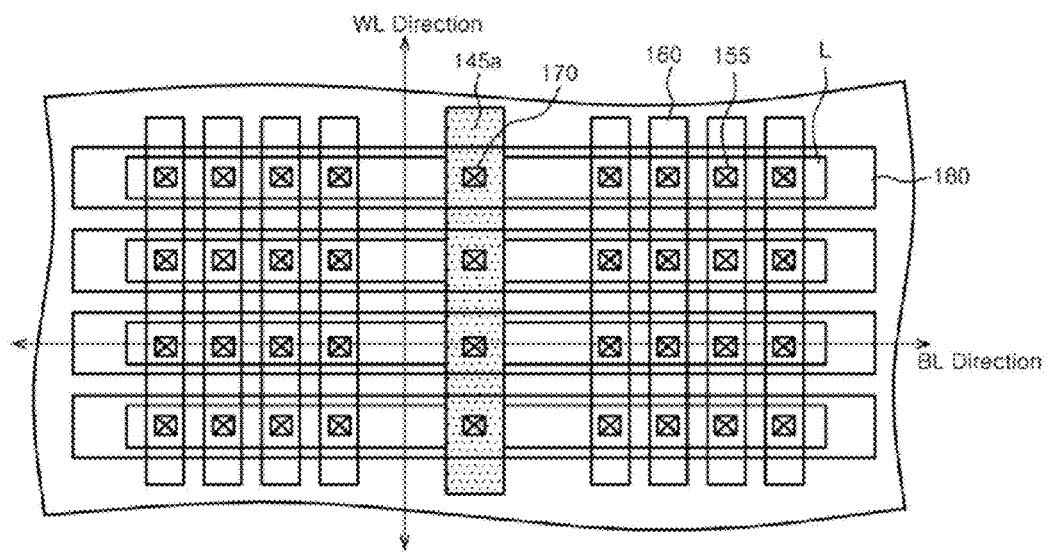
Figure 2J:
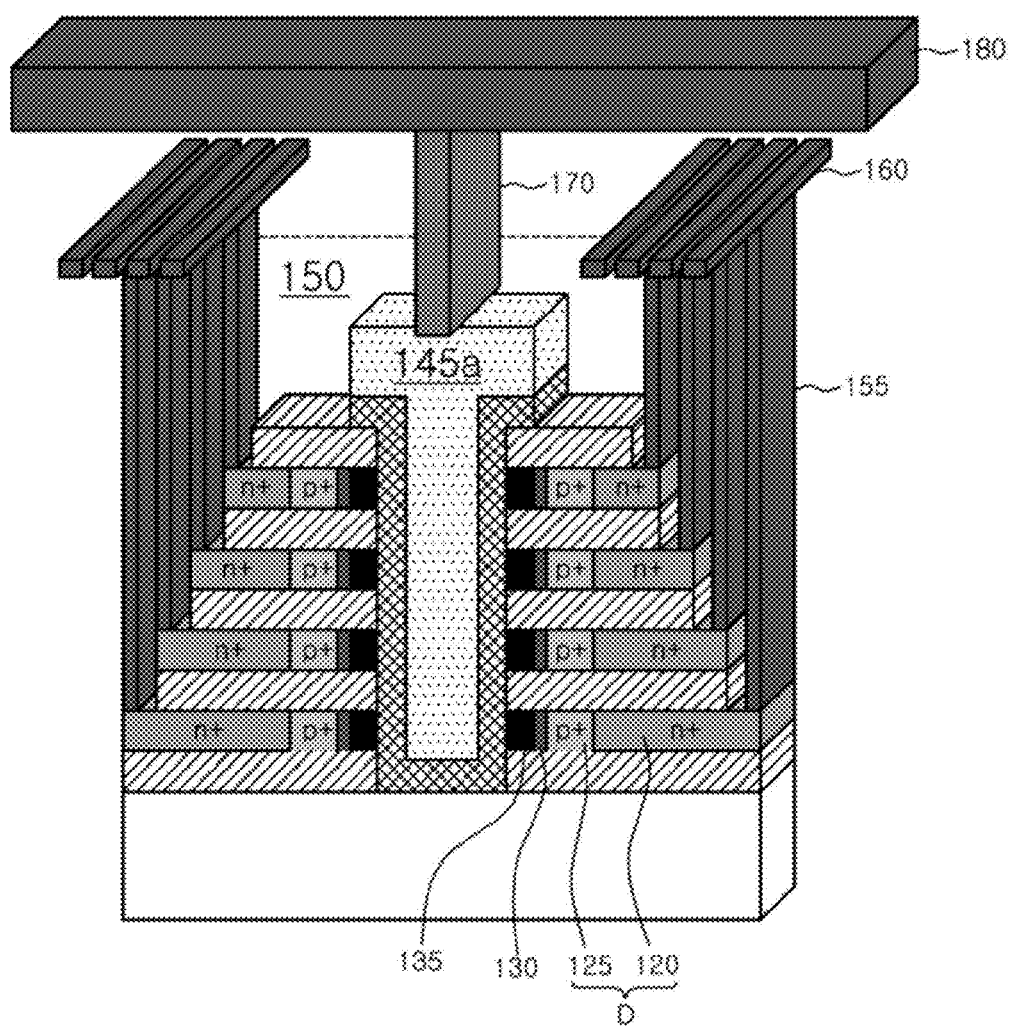
FIG. 2J is a perspective view illustrating a semiconductor integrated circuit device according to an exemplary embodiment.
Figure 3I:
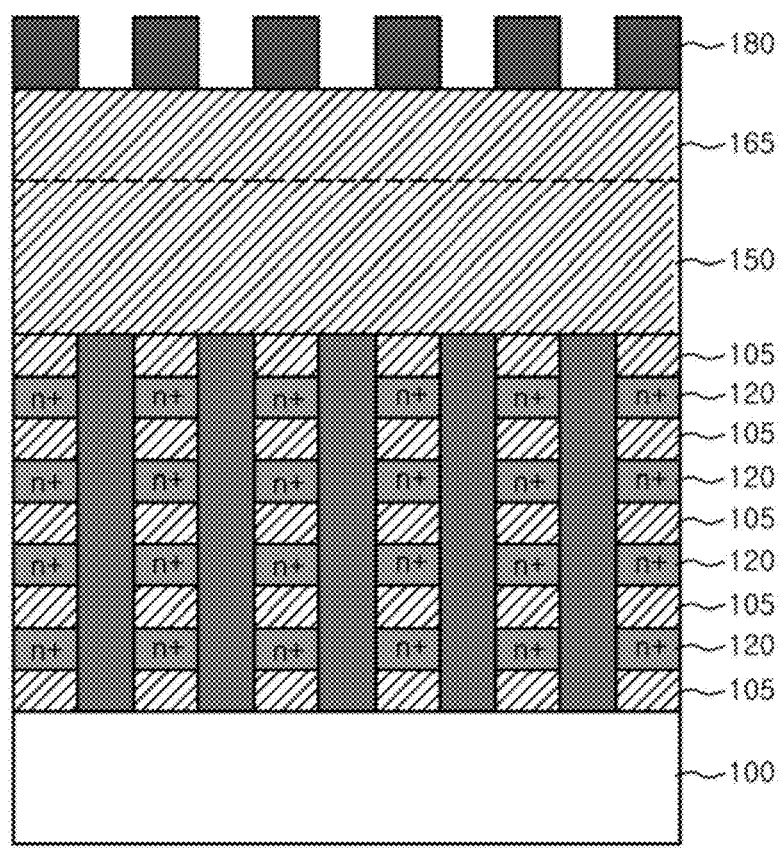

Referring to FIGS. 1F, 2J, and 3I, a first interlayer insulating layer 150 is formed on a resultant structure of the semiconductor substrate 100 including the pyramid-processed stacking structure and etched to form contact holes (not shown) exposing an edge of the n⁺-polysilicon layers 120 exposed by the first material layers 105. A first metal material fills the contact holes to form a first metal contact unit 155s, and first metal interconnections 160 are formed on the first metal contact units 155. The first metal interconnection 160 may be a word line of the phase-change memory device. A second interlayer insulating layer 165 is formed on the first interlayer insulating layer 150 and etched to form a via hole (not shown) exposing the upper electrode 145a. A second metal contact until 170 fills the via holes. Next, a second metal interconnection 180 is formed on the second interlayer insulating layer 165 to be in contact with the second metal contact unit 170. The second metal interconnection 180 may be a bit line of the phase-change memory device. The bit line 180 may be substantially perpendicular to the word line 160.

Referring to FIG. 4, the word line 160 is electrically connected to a metal word line 260 disposed in the peripheral circuit area 250 in a periphery of a cell region. The reference symbol WLC denotes a contact for connecting the metal word line 260 to the word line 160. However, the exemplary embodiments of the present invention are not limited to the above-described arrangement and the peripheral circuit area 250 may be configured in various shapes.

Figure 5:
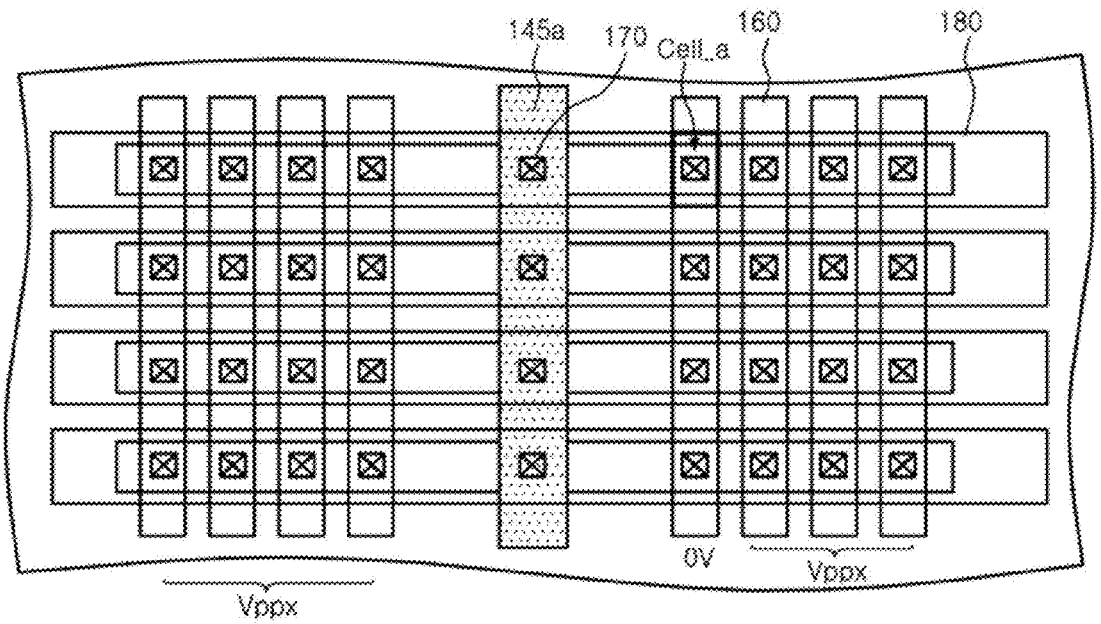
FIG. 5 is a plan view illustrating a method of driving a semiconductor integrated circuit device according to an exemplary embodiment.

As shown in FIG. 5, a word line 160 (hereinafter, a select word line) connected to a specific cell Cell_a. A voltage of 0V may be applied to the switching structure of a specific cell Cell_a if the specific cell Cell_a is selected. A program voltage Vppx may be applied to non-selected word lines 160.

Next, a write voltage V_write or a read voltage V_read may be applied to a bit line 180 corresponding to the specific cell Cell_a, and other non-selected bit lines 180 are floating or grounded. Through this process, the specific cell Cell_a may write or read.

Figure 6:
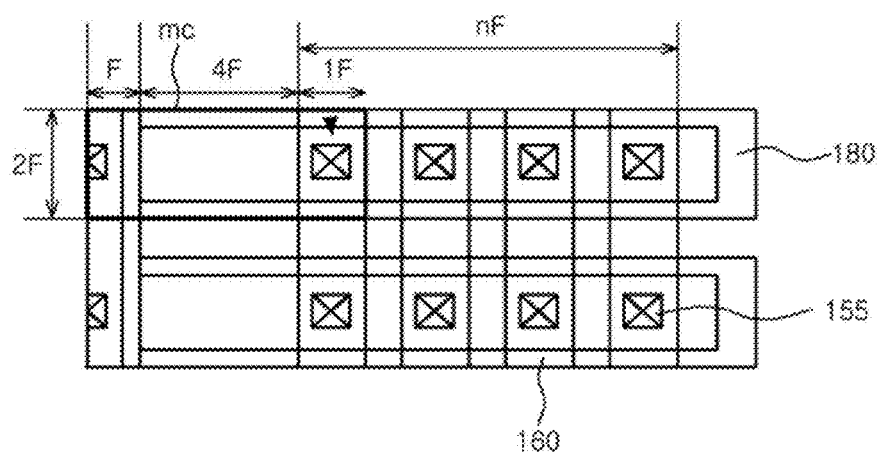
FIG. 6 is a plan view illustrating an area of a unit cell of a semiconductor integrated circuit device according to an exemplary embodiment.

Referring to FIG. 6, an average area of a unit memory cell mc of the phase-change memory cell according to an exemplary embodiment may be expressed in the following equation.

$$\text{average area of a unit memory cell} = 2F \times (4F + nF)/n \quad \text{(Equation)}$$

where F denotes a minimum feature size and n denotes the number of diodes stacked.

The following table shows an average area according to the number of diodes stacked.

TABLE

| n (Number of diodes stacked) | Average area of unit memory cell |
|---|---|
| 4 | 4.0 F2 |
| 8 | 3.0 F2 |
| 16 | 2.5 F2 |

As the number of diodes stacked is increased, an average area of the unit memory cell is reduced.

As described above, by stacking memory cells at both sides of a phase-change pattern line disposed in plurality, cell integration density can be significantly improved.

Figure 7:
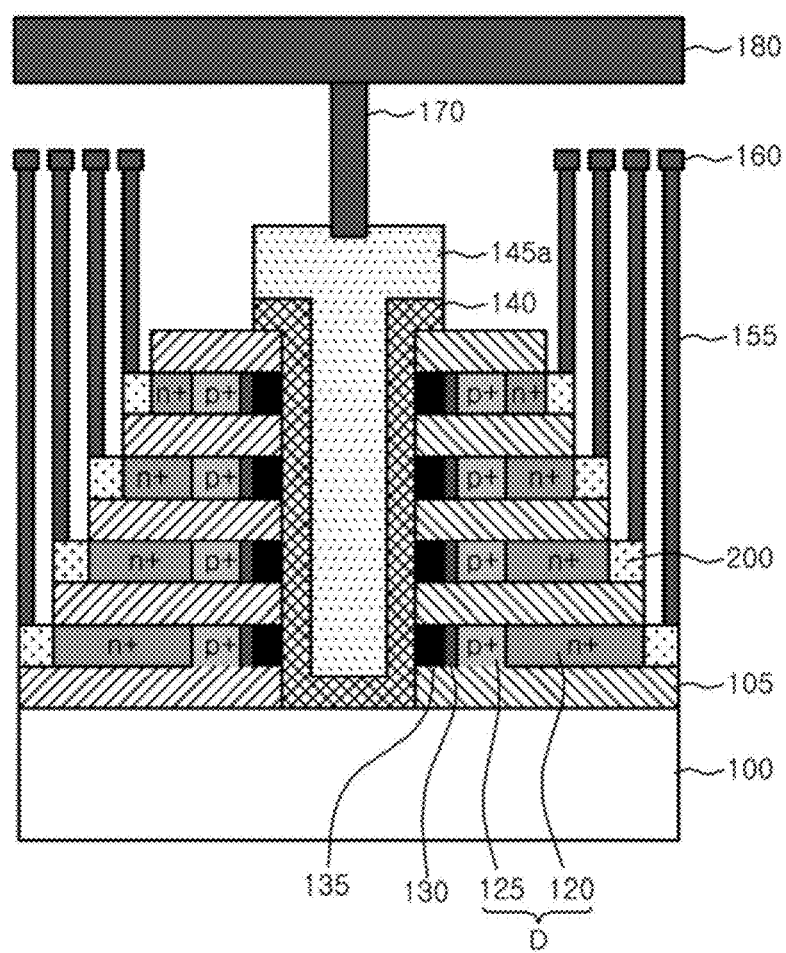
FIG. 7 is a cross-sectional view illustrating a semiconductor integrated circuit device according to another exemplary embodiment.

Referring to FIG. 7, although only a switching device was formed within a horizontal hole in the above-described exemplary embodiment, barrier metal layers 200 may also be formed on outer sides of n⁺-polysilicon layers 120. First metal contacts 155 are in contact with the barrier metal layers 200 so that a resistance of the switching device is reduced. The barrier metal layer 200 includes, for example, tungsten (W), TiN or Ti/TiN. Further, the barrier metal layer 200 may be deposited and etched back to be formed before the n⁺-polysilicon layer 120 is formed.

Figure 8:
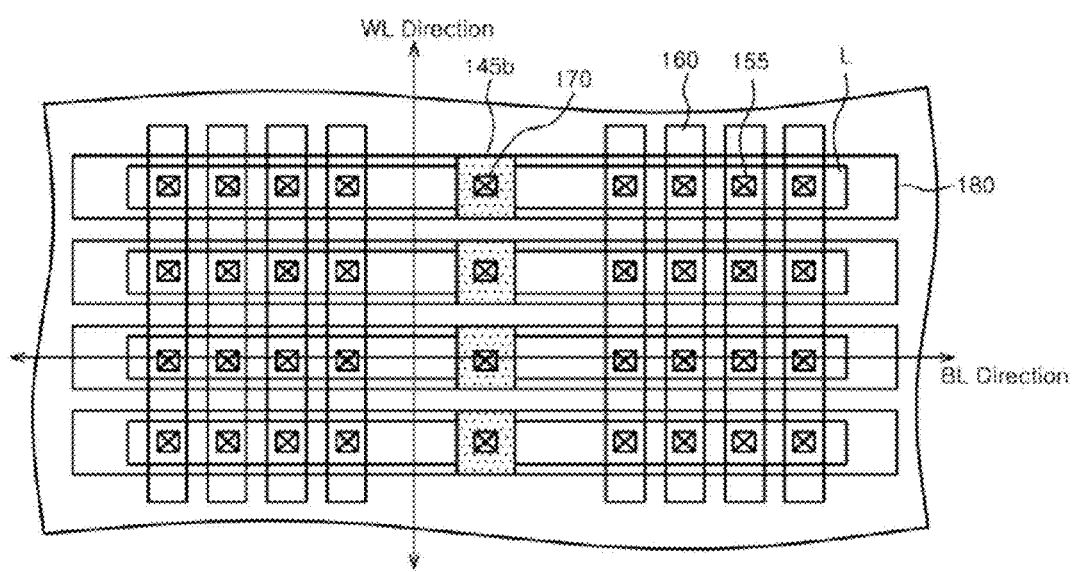
FIG. 8 is a plan view illustrating a semiconductor integrated circuit device according to another exemplary embodiment and FIGS. 9 to 13 are cross-sectional views illustrating semiconductor integrated circuit devices according to other exemplary embodiments.

Referring to FIG. 8, in another exemplary embodiment, a resistive memory unit 145b may be formed in a pillar type so that the resistive memory unit 145b remains at a connection portion with a bit line 180.

Figure 9:
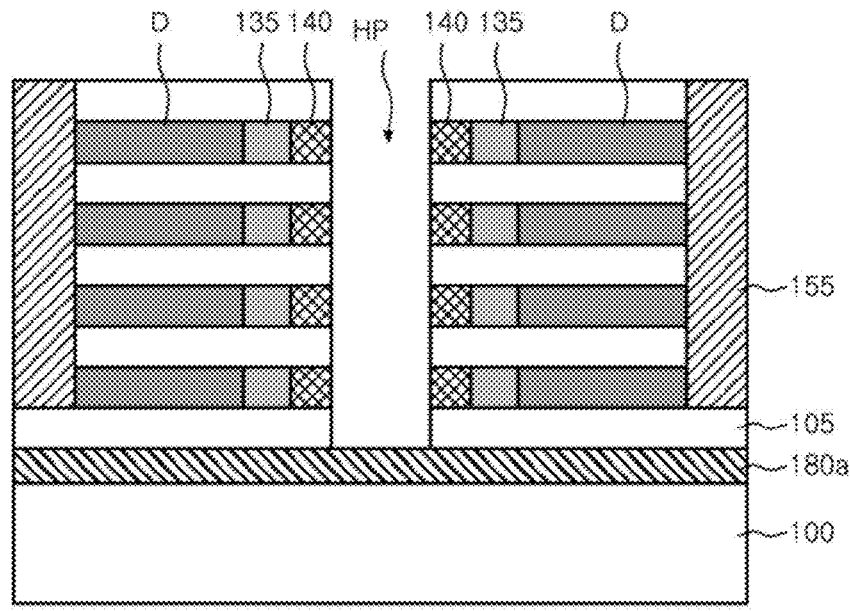

Referring to FIG. 9, in an exemplary embodiment, a phase-change material layer 140 is formed within a horizontal hole HH in a buried type. Although the bit line 180 is disposed over the word line 160 in the above-described embodiment, a bit line 180a is disposed between a substrate 100 and a lowermost first material layer 105 of a rectangular prism stacking structure. If the bit line 180 is formed below the switching structure, a total height of the phase-change memory device can be reduced and more switching structures may be deposited.

Although it is illustrated that first metal contact units 155 are simultaneously in contact with a plurality of switching structures in FIG. 9 for illustration purposes, for example, only one first metal contact unit 155 is substantially contacted with any one switching structure.

Figure 10:
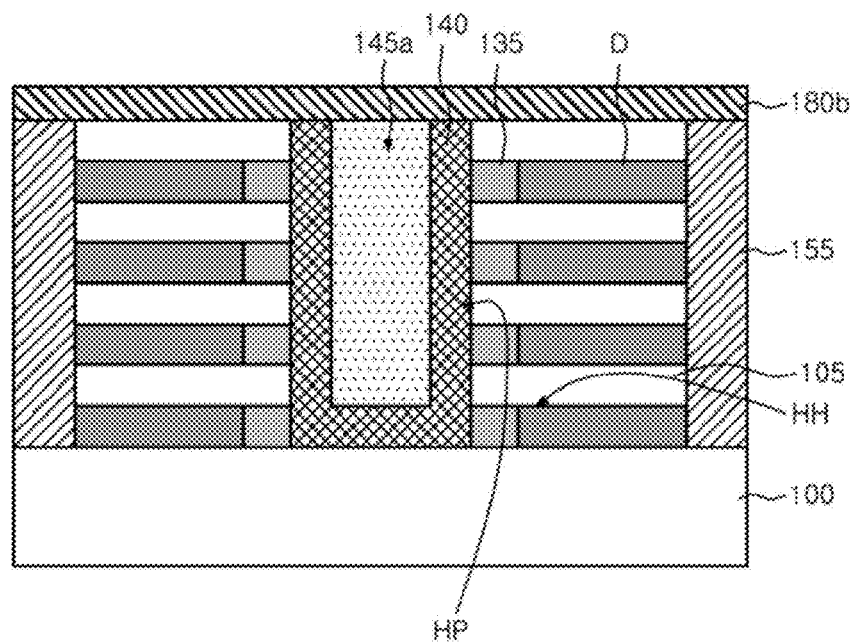

Referring to FIG. 10, an exemplary embodiment illustrates the phase-change memory device where an upper electrode 145a is completely buried within a vertical hole HP. A process of manufacturing the phase-change memory device before forming a heating electrode 135 is the same as the process of the above-described exemplary embodiment as shown in FIGS. 2A to 2G. A phase-change material layer 140 is formed along a sidewall of the vertical hole HP, and an upper electrode material is formed to fill the vertical hole HP. Next, the upper electrode material and the phase-change material layer 140 are chemical mechanical polished to expose an uppermost first material layer 105. After the polishing step, the upper electrode 145a is only formed within the vertical hole HP. A second metal interconnection 180b, that is, a bit line 180b, is formed on the uppermost first material layer 105. The second interconnection 180b is also in contact with the upper electrode 145a. Although it is illustrated that first metal contact units 155 are simultaneously in contact with a plurality of switching structures in FIG. 10 for illustration purposes, only one first metal contact unit 155 is substantially contacted with any one switching structure. In addition, although it is illustrated that the metal second interconnection 180b is in contact with the first metal contact units 155 when viewed in a cross-section, the second metal interconnection 180b is not substantially in contact with the first metal contact units 155.

According to the exemplary embodiment shown in FIG. 10, since a separate mask process to pattern the upper electrode 145a is not performed, the manufacturing process uses fewer steps.

Figure 11:
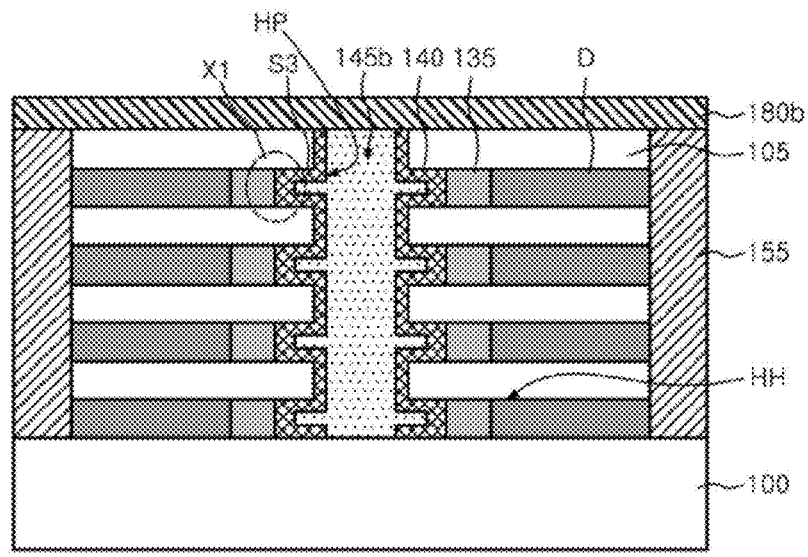

Referring to FIG. 11, a process of manufacturing the phase-change memory device before forming the diode D is the same as the process according to the above-described exemplary embodiment as shown in FIGS. 2A to 2E. Heating electrodes 135 are formed within the horizontal hole HH so that spaces S3 are additionally provided within the horizontal hole HH. The heating electrodes 135 are not formed to completely fill the horizontal hole HH so that a sidewall of a switching structure is recessed from a sidewall of a first material layer 105. Next, a phase-change material layer 140 is formed along surfaces of the vertical hole HP and the spaces S3 so that the phase-change material layer 140 is formed to have a convex and concave surface in the spaces S3. An upper electrode material fills the vertical hole HP, and the upper electrode material and the phase-change material layer 140 are chemical mechanical polished to expose an uppermost first material layer 105. Therefore, an upper electrode 145b including a portion protruding into the spaces S3 is formed. Next, a second metal interconnection 180b that is, a bit line 180b, is formed on the uppermost first material layer 105 to be in contact with the upper electrode 145b.

Although it is illustrated that the first metal contact units 155 is simultaneously in contact with a plurality of switching structures, one first metal contact unit 155 is substantially in contact with any one of switching structures in FIG. 11. In addition, although it is illustrated that the second metal interconnection 180b is in contact with the first metal contact units 155, the second metal interconnection 180b is not substantially in contact with the first metal contact unit 155.

According to the exemplary embodiment shown in FIG. 11, as the phase-change material layer 140 is formed in a convex and concave shape, an effective distance x1 between substantially phase-changed portions of the switching structures is formed so that it is advantageous to a disturbance characteristic between unit memory cells.

Figure 12:
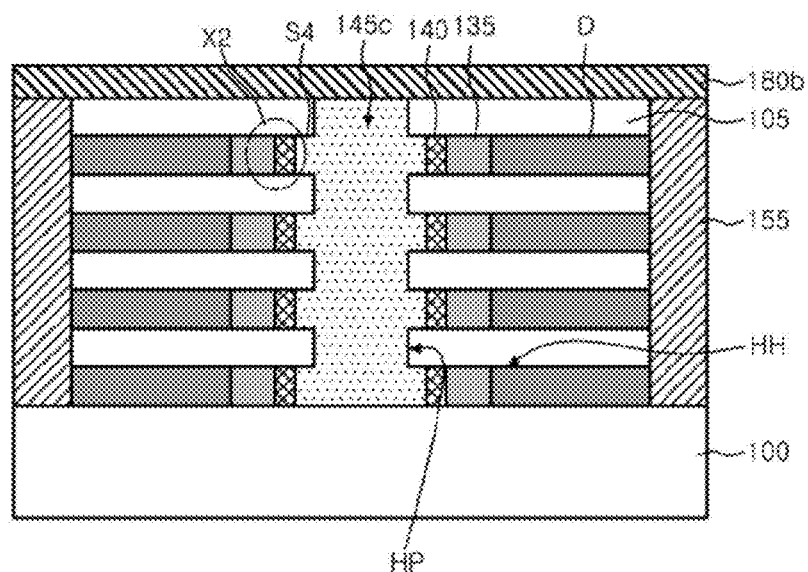

A process shown in FIG. 12 before a process of depositing a phase-change material layer 140 is the same as the process in FIG. 11.

Referring to FIG. 12, the phase-change material layer 140 is deposited and an etch-back or pull-back process is performed to dispose the phase change material layer 140 within a horizontal hole HH. The phase-change material layer 140 does not completely fill the spaces S3 so that the phase-change material layer 140 is formed in a pattern shape. Thereby, additional spaces S4 are provided next to the phase-change material layer 140. Next, an upper electrode material is filled within the horizontal hole HH and the spaces S4, and the upper electrode 145c is chemical mechanical polished to expose an uppermost first material layer 105. Next, a second metal interconnection 180b is formed on the first material layer 105.

In the phase-change memory device according to the exemplary embodiment, a phase-change is caused in the phase-change material layer 140 corresponding to a contact boundary with a heating electrode 135. In FIG. 12, x2 denotes a phase-changed region.

In the exemplary embodiment shown in FIG. 12, the vertical hole HP has a convex and concave sidewall so that a distance between the phase-changed regions x2 remains constant. Therefore, a disturbance characteristic of the phase-change memory device can be increased.

Figure 13:
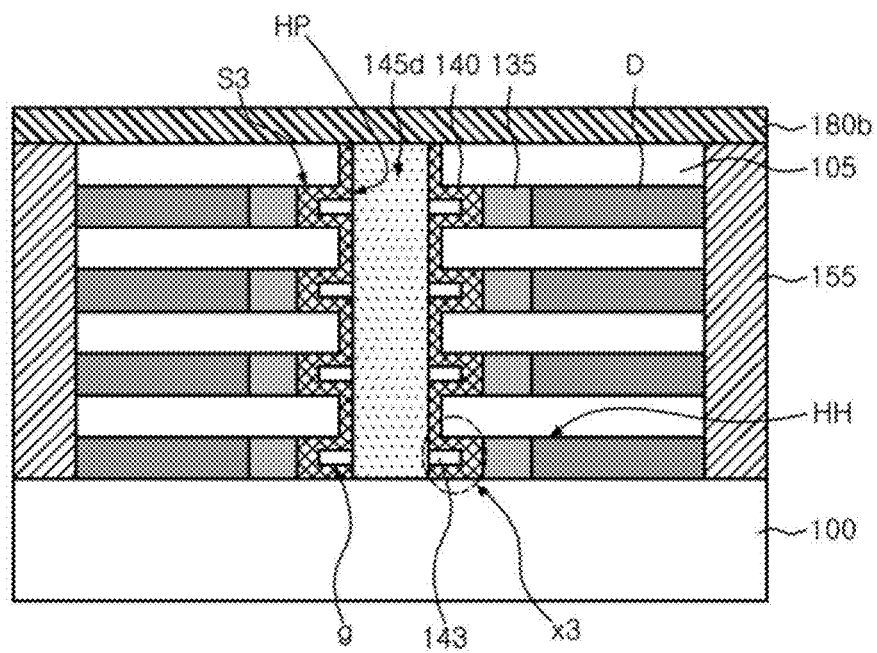

A method of manufacturing the phase-change memory device in FIG. 13 before depositing a phase-change material layer 140 is the same as the process of FIG. 11.

Referring to FIG. 13, the phase-change material layer 140 is deposited along surfaces a vertical hole HP and in the spaces S3. At this time, grooves g are provided on a surface of the phase-change material layer 140 in the spaces s3. An insulating layer 143 is deposited on the surface of the phase-change material layer 140 that fills the grooves g, and the insulating layer 143 is anisotropically etched to be buried within the grooves g. An upper electrode material is filled within the vertical hole HP, and the upper electrode 145d is chemical mechanical polished to expose an uppermost first material layer 105.

In the above-described phase-change memory device, a phase-change x3 is caused above and below the insulating layer 143. Since the insulating layer 143 is interposed between the phase-change material layers 140 extending substantially perpendicular to a surface of a substrate 100, a current path can be reduced and a current used for the phase-change can be reduced.

According to the exemplary embodiments of present invention, switching structures are stacked and disposed on both sides of an upper electrode electrically connected to a bit line to increase integration density.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of manufacturing a semiconductor integrated circuit device, comprising:
    forming a multi-layered insulating structure on a semiconductor substrate;
    forming a vertical hole in a predetermined portion of the multi-layered insulating structure;
    forming a plurality of horizontal holes in the insulating structure at both sides of the vertical hole and extending in a direction parallel to the semiconductor substrate;
    forming a switching structure in each of the plurality of horizontal holes;
    forming a phase-change material layer on a sidewall of the switching structure;
    forming an upper electrode in contact with the phase-change material layer within the vertical hole;
    forming word lines to be electrically connected to outer edge portions of the switching structures; and
    forming a bit line to be electrically connected to the upper electrode.

2. The method of claim 1, wherein the forming the multi-layered insulating structure includes sequentially and alternatively, stacking a first material layer and a second material layer having different etch selectivity from each other, and
    wherein the first material layer is formed on the semiconductor substrate and in an uppermost layer.

3. The method of claim 1, wherein the forming the plurality of horizontal holes includes:
    selectively removing the second material layers; and
    forming the horizontal holes by removing the second material layers.

4. The method of claim 3, wherein the first material layer includes a silicon oxide layer and the second material layer includes a silicon nitride layer.

5. The method of claim 1, wherein the forming the switching structure in each of the horizontal holes includes;
    forming a diode on an inner side of each of the horizontal holes; and
    forming a heating electrode on one side of the diode.

6. The method of claim 5, wherein the founing the diode includes:
forming an n type polysilicon layer within each of the horizontal holes;
performing a pull back process for the n type polysilicon layer; and
forming a p type polysilicon layer on a side of the n type polysilicon layer and performing a pull back process for the p type polysilicon layer.

7. The method of claim 6, further comprising, before forming the diode, forming a barrier metal layer within each of the horizontal holes.

8. The method of claim 5, wherein the forming the heating electrode includes:
filling a conductive material layer within each of horizontal holes; and
anisotropically etching the conductive material layer to be buried within each of the horizontal holes.

9. The method of claim 8, wherein the forming the heating electrode includes:
filling a conductive material layer within each of the horizontal holes; and
performing a pull back process for the conductive material layer so that a space remains in each of the horizontal holes.

10. The method of claim 9, wherein the forming the phase-change material layer includes forming a phase-change material layer to be filled within each of the horizontal holes.

11. The method of claim 9, wherein the forming the phase-change material layer includes:
forming a phase-change material layer; and
performing a pull back process for the phase-change material layer so that an additional space remains within each of the horizontal holes.

12. The method of claim 11, wherein the forming the upper electrode includes forming the upper electrode filled within the vertical hole and the additional space within each of the horizontal holes.

13. The method of claim 9, wherein the forming the phase-change material layer includes forming the phase-change material layer along a surface of the space of each of the horizontal holes so that groove units are included on a surface of the phase-change material layer.

14. The method of claim 13, further comprising, between the forming the phase-change material layer and the forming the upper electrode, forming an insulating layer to be buried within the groove units.

15. The method of claim 1, further comprising, after the forming the upper electrode:
pyramid-processing to expose the outer edges portions of the switching structures stacked,
wherein the word lines are formed to be electrically connected to the exposed outer edge portions of the switching structures.

16. The method of claim 15, wherein the pyramid-processing includes etching the switching structures by repeatedly performing a sliming process for a photomask and a reactive ion etching process.

* * * * *